(12) United States Patent
Furudate

(10) Patent No.: US 7,659,720 B2
(45) Date of Patent: Feb. 9, 2010

(54) MAGNETIC RESONANCE IMAGING APPARATUS AND METHOD OF SETTING SLICE-AREA/SLICE-VOLUME ORIENTATION AT EACH MOVED COUCH POSITION

(76) Inventor: Naoyuki Furudate, c/o Intellectual Property Department, Toshiba Medical Systems Corporation, 1385, Shimoishigami, Otawara-shi, Tochigi 324-8550 (JP)

( * ) Notice: Subject to any disclaimer, the term of this patent is extended or adjusted under 35 U.S.C. 154(b) by 65 days.

(21) Appl. No.: 12/020,335

(22) Filed: Jan. 25, 2008

(65) Prior Publication Data
US 2008/0180104 A1 Jul. 31, 2008

(30) Foreign Application Priority Data
Jan. 29, 2007 (JP) ............................. 2007-017729
Oct. 29, 2007 (JP) ............................. 2007-280655

(51) Int. Cl.
*G01V 3/00* (2006.01)
(52) U.S. Cl. ...................................... 324/318; 324/309
(58) Field of Classification Search ......... 324/300–322; 600/407–435
See application file for complete search history.

(56) References Cited

U.S. PATENT DOCUMENTS 6,512,373 B1 * 1/2003 Griffin et al. ................. 324/318
6,794,869 B2 * 9/2004 Brittain ....................... 324/309
6,801,034 B2 * 10/2004 Brittain et al. .............. 324/309
6,891,374 B2 * 5/2005 Brittain ....................... 324/309
6,897,655 B2 * 5/2005 Brittain et al. .............. 324/309
6,946,836 B2 * 9/2005 Kuhara ....................... 324/307
2002/0021128 A1 * 2/2002 Kuhara ....................... 324/309
2002/0140423 A1 * 10/2002 Brittain ....................... 324/301
2002/0173715 A1 * 11/2002 Kruger et al. ............... 600/410
2003/0011369 A1 * 1/2003 Brittain et al. .............. 324/309
2004/0155654 A1 * 8/2004 Brittain ....................... 324/309
2004/0263171 A1 * 12/2004 Yamagata ................... 324/318
2008/0039867 A1 * 2/2008 Feussner et al. ............ 606/130
2008/0180104 A1 * 7/2008 Furudate .................... 324/318

FOREIGN PATENT DOCUMENTS

| JP | 6-189934 | 7/1994 |
| JP | 2003-290171 | 10/2003 |
| JP | 2003-290172 | 10/2003 |
| JP | 2006-129937 | 5/2006 |

* cited by examiner

*Primary Examiner*—Brij B. Shrivastav
*Assistant Examiner*—Tiffany A Fetzner

(57) ABSTRACT

An observation-point arranging unit arranges an observation point indicating a portion to be included in a slice area on a positioning image displayed on a display device. A scanning-condition receiving unit receives a specification of a scanning condition including number of movements of a couch on which an object is placed during scanning and a size of the slice area. A slice-area setting unit sets the slice area including the observation point for each position to which the couch is to be moved, based on the observation point and the scanning condition. A scanning unit scans the object multiple times while moving the couch, based on the slice area.

25 Claims, 7 Drawing Sheets

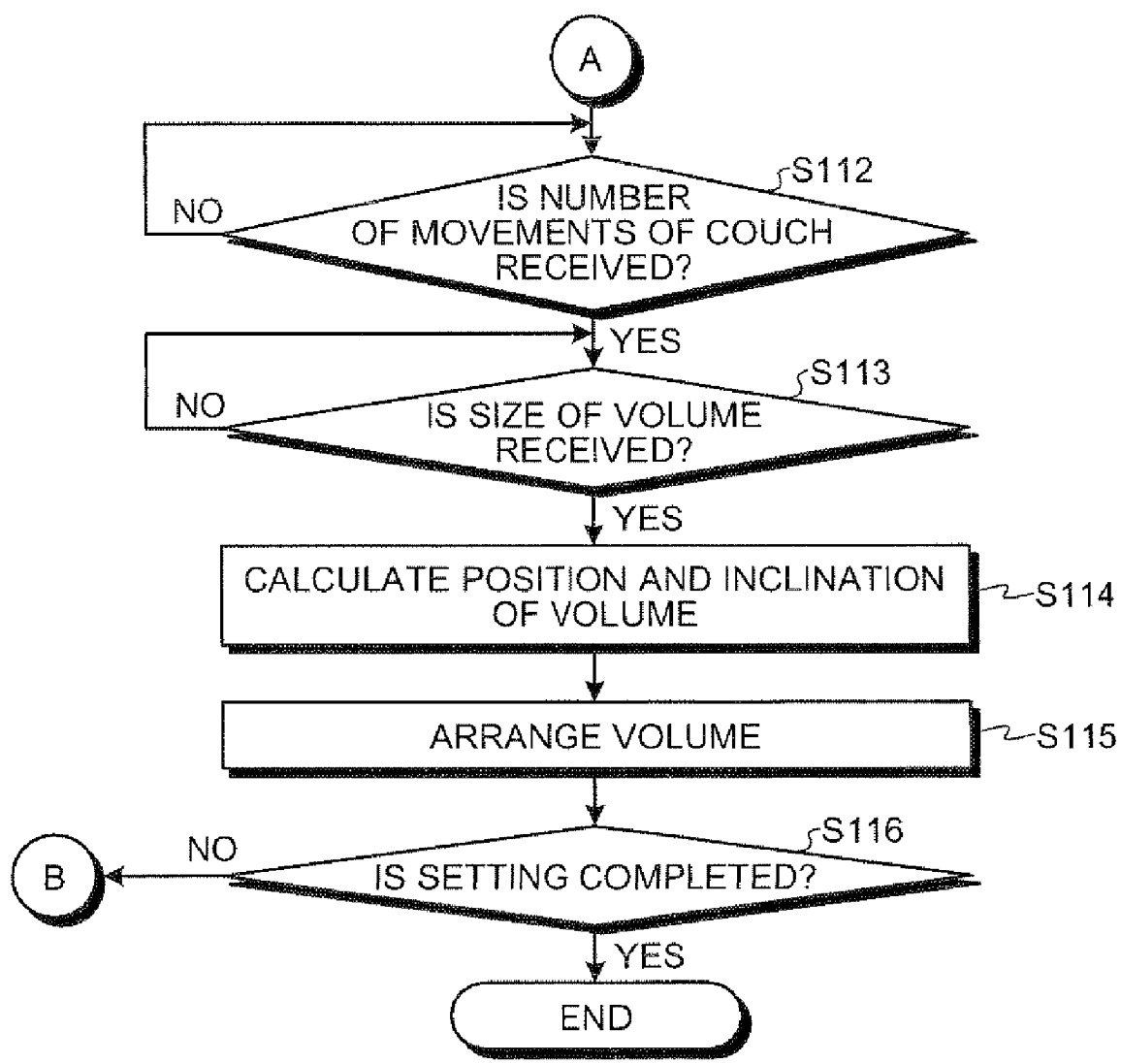

MAGNETIC RESONANCE IMAGING APPARATUS AND METHOD OF SETTING SLICE-AREA/SLICE-VOLUME ORIENTATION AT EACH MOVED COUCH POSITION

CROSS-REFERENCE TO RELATED APPLICATIONS

This application is based upon and claims the benefit of priority from the prior Japanese Patent Application No. 2007-017729, filed on Jan. 29, 2007 and the prior Japanese Patent Application No. 2007-280655, filed on Oct. 29, 2007; the entire contents of which are incorporated herein by reference.

BACKGROUND OF THE INVENTION

1. Field of the Invention

The present invention relates to a magnetic resonance imaging apparatus and a method of setting a slice area.

2. Description of the Related Art

In a conventional method of setting a slice area for a magnetic resonance imaging apparatus, a tomographic image of an object is taken in advance as a positioning image, an operator sets a slice area for an actual scanning by arranging slice areas with respect to the positioning image displayed on a console (see, for example, JP-A 2003-290171 (KOKAI) or JP-A 2003-290172 (KOKAI)).

A magnetic resonance imaging apparatus generally excites hydrogen nuclei inside an object by irradiating the object placed in a static magnetic field with a radio frequency (RF) wave, and reconstructs an image from magnetic resonance signals emitted by the excitation of the hydrogen nuclei. However, a scan image may be degraded at a position far from the center of the static magnetic field because the static magnetic field becomes nonuniform with increasing distance from the center of the static magnetic field.

For this reason, if a scanning needs to be performed on an object across a wide range, the scanning is performed multiple times by moving a couch in the direction of the body axis of the object. In this case, the slice area needs to be set for each movement of the couch, and when setting the slice area using the positioning image, a rectangular parallelepiped range representing the slice area (hereinafter, "a volume") is arranged to a position of the couch with respect to the positioning image. At this time, the operator arranges the volume in such a manner that a region of interest is included inside the volume by adjusting the position and the orientation inclination in accordance with a body part and a posture of the object.

However, for example, when performing angiography of a lower limb, there is a problem that an operation of setting the volume is cumbersome and complicated, because it is difficult to arrange the volume in such a manner that blood vessels in the region of interest completely fall within the volume. It is because that the angiography of the lower limb requires a wide range scanning, so that the scanning is performed multiple times, and furthermore, the lower limb cannot be stretched to a perfectly straight form and blood vessels inside the lower limb run three-dimensionally.

SUMMARY OF THE INVENTION

According to an aspect of the present invention, there is provided a magnetic resonance imaging apparatus including an observation-point arranging unit that arranges an observation point indicating a portion to be included in a slice area on a positioning image displayed on a display device; a scanning-condition receiving unit that receives a specification of a scanning condition including number of movements of a couch on which an object is placed during scanning and a size of the slice area; a slice-area setting unit that sets the slice area including the observation point arranged by the observation-point arranging unit for each position to which the couch is to be moved, based on the observation point arranged by the observation-point arranging unit and the scanning condition received by the scanning-condition receiving unit; and a scanning unit that scans the object multiple times while moving the couch, based on the slice area set by the slice-area setting unit.

Furthermore, according to another aspect of the present invention, there is provided a magnetic resonance imaging apparatus including a characteristic-information acquiring unit that acquires characteristic information representing anatomical characteristics of an object from a positioning image of the object; a scanning-condition determining unit that determines a scanning condition including number of movements of a couch on which the object is placed during scanning and a size of a slice area, based on the characteristic information acquired by the characteristic-information acquiring unit; a slice-area setting unit that sets the slice area for each position to which the couch is to be moved, based on the scanning condition determined by the scanning-condition determining unit; and a scanning unit that scans the object multiple times while moving the couch, based on the slice area set by the slice-area setting unit.

Moreover, according to still another aspect of the present invention, there is provided a method of setting a slice area including arranging an observation point indicating a portion to be included in a slice area on a positioning image displayed on a display device; receiving a specification of a scanning condition including number of movements of a couch on which an object is placed during scanning and a size of the slice area; and setting the slice area including the observation point arranged at the arranging for each position to which the couch is to be moved, based on the observation point arranged at the arranging and the scanning condition received at the receiving. A scanning of the object is performed multiple times while moving the couch, based on the slice area set at the setting.

Furthermore, according to still another aspect of the present invention, there is provided a method of setting a slice area including acquiring characteristic information representing anatomical characteristics of an object from a positioning image of the object; determining a scanning condition including number of movements of a couch on which the object is placed during scanning and a size of a slice area, based on the characteristic information acquired at the acquiring; and setting the slice area for each position to which the couch is to be moved, based on the scanning condition determined at the determining. A scanning of the object is performed multiple times while moving the couch, based on the slice area set at the setting.

BRIEF DESCRIPTION OF THE DRAWINGS

FIG. 9 is a flowchart of the slice-area setting process performed by the computer shown in FIG. 6 (part 2).

DETAILED DESCRIPTION OF THE INVENTION

Exemplary embodiments of the present invention will be explained below in detail with reference to the accompanying drawings. An embodiment is explained below in a case where a sagittal image and a coronal image are used as positioning images, and a slice area on the coronal image is set as a slice area for actual scanning.

A concept of a method of setting a slice area by a magnetic resonance imaging (MRI) apparatus according to an embodiment of the present invention is explained with reference to FIGS. 1 to 5. It is assumed that an object to be scanned is an object P, and a sagittal image and a coronal image of the object P have been already taken and stored in the MRI apparatus.

Figure 1:
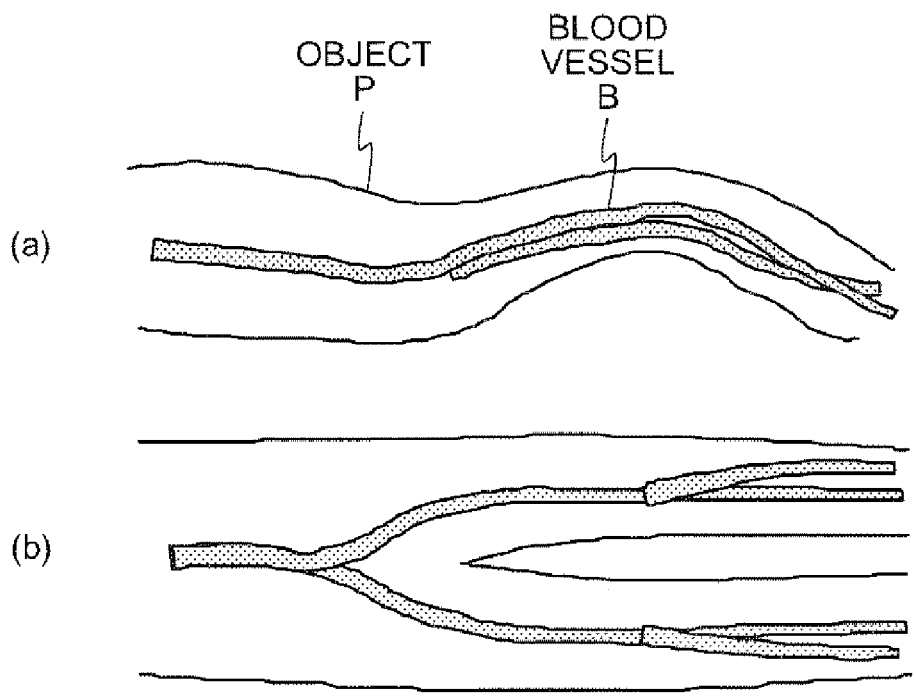
FIG. 1 is a schematic diagram for explaining positioning images according to an embodiment of the present invention.

When setting a slice area by the MRI apparatus, an operator instructs the MRI apparatus to display the positioning images of the object P. When receiving the instruction, the MRI apparatus fetches the sagittal image and the coronal image of the object P from stored images, and displays the fetched images on a console as shown in FIG. 1. A section (a) of FIG. 1 is a sagittal image of a lower limb of the object P, and a section (b) is a coronal image of the lower limb of the object P. As shown in FIG. 1, each of the images includes an image of blood vessel B inside the lower limb.

Figure 2:
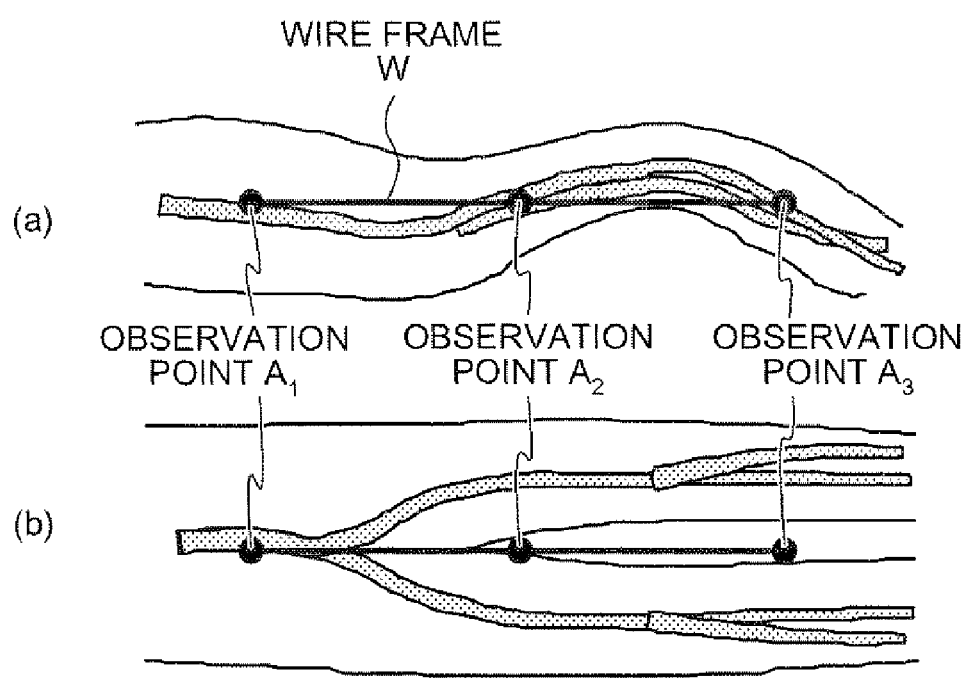
FIG. 2 is a schematic diagram for explaining display of observation points and a wire frame on the positioning images shown in FIG. 1.

The MRI apparatus defines a predetermined number of points on a space reflected on each of the sagittal image and the coronal image, and displays the defined points onto each of the images as shown in FIG. 2. The points are hereinafter referred to as observation points. FIG. 2 depicts a case where three observation points are defined, and observation points $A_1$, $A_2$, and $A_3$ displayed on the sagittal image indicate the same points as observation points $A_1$, $A_2$, and $A_3$ displayed on the coronal image. The MRI apparatus displays a connecting line W that connects between an observation point and an observation point on each of the images as shown in FIG. 2. The connecting line W is hereinafter referred to as a wire frame.

The observation points displayed on the sagittal image and the coronal image are to be used for the operator to specify a point to be included in a slice area. By operating an input device, such as a mouse or a trackball provided on the console, the operator rearranges the observation points along the image of the blood vessel B included in each of the images. When rearranging, the operator can move or delete an observation point, add a new observation point between two observation points, or add a new observation point that branches out from one of the observation points as a branch point, on each of the images.

Figure 3:
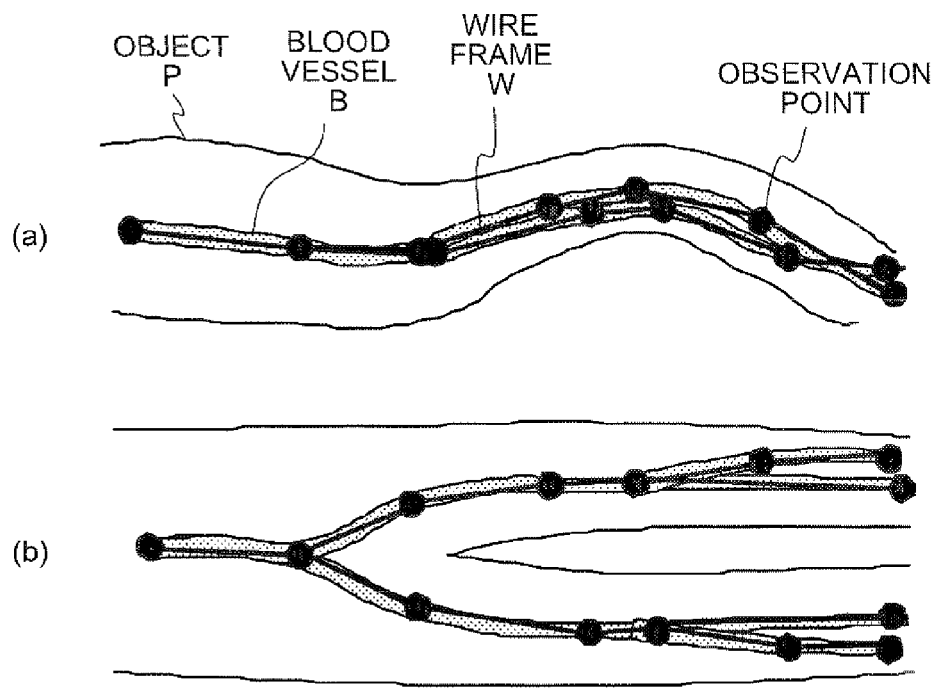
FIG. 3 is a schematic diagram for explaining a change of observation points and a wire frame according to the embodiment.

The MRI apparatus changes display of the observation points in response to each of the above operations, and when moving an observation point displayed on the sagittal image, the MRI apparatus moves the same observation point displayed on the coronal image at the same time correspondingly to the movement. Likewise, when moving an observation point displayed on the coronal image, the MRI apparatus moves the same observation point displayed on the sagittal image. The MRI apparatus automatically changes display of the wire frame W in conjunction with the change in the observation points as shown in FIG. 3.

After an arrangement of the observation points is finished, the operator specifies scanning conditions for actual scanning to the MRI apparatus. Specifically, the operator specifies the number of movements of a couch, and a size of a volume representing a slice area. To specify the size of a volume, the operator specifies lengths of orthogonal three sides of a rectangular parallelepiped that represents the volume. The lengths of the three sides are referred to as a slice length, a slice width, and a slice thickness. After all of the scanning conditions are specified, the operator instructs the MRI apparatus to set a slice area.

Figure 4:
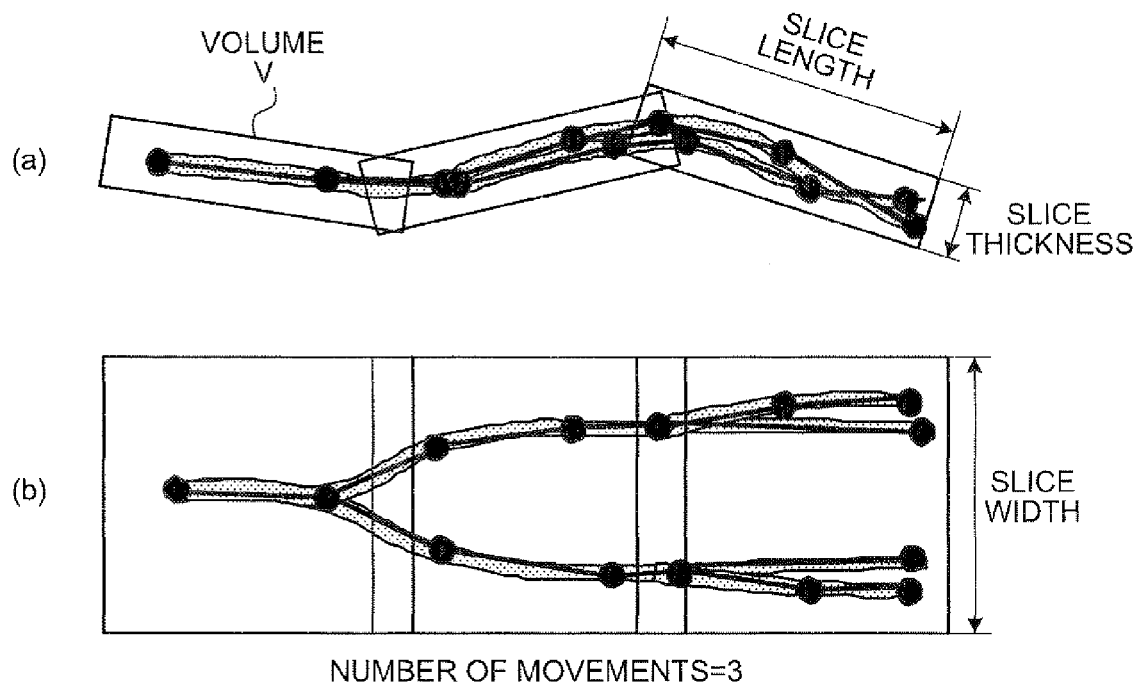
FIG. 4 is a schematic diagram for explaining display of volumes according to the embodiment.

When receiving the instruction, the MRI apparatus arranges the volume representing the slice area onto each of the images based on the observation points arranged on the sagittal image and the coronal image, and the specified scanning conditions. FIG. 4 is an arrangement of volumes V when the number of movements of the couch is three. As shown in FIG. 4, the MRI apparatus arranges the volumes V in the specified size by laying out as many as the specified number of movements of the couch along the direction of a body axis of the object P.

When arranging the volumes V, each of the volumes V is arranged such that the most observation points are included inside the volumes V. If observation points are scattered to a great extent, there is a case where all of the observation points may not fall within the volumes in the size specified by the operator.

The operator checks whether the slice areas are appropriately set by checking a state of the volumes displayed on the sagittal image and the coronal image. If the slice areas are not appropriately set, the operator changes the arrangement of the observation points, or changes the scanning conditions.

Figure 5:
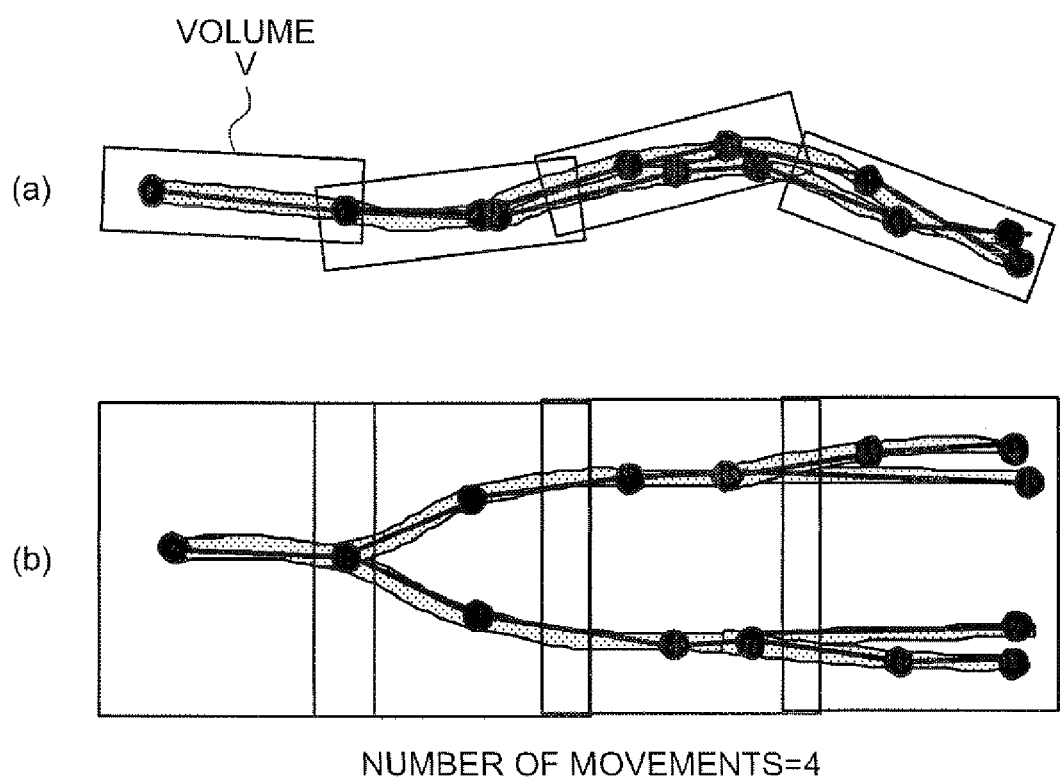
FIG. 5 is a schematic diagram for explaining a change of volumes according to the embodiment.

In response to each of the operations, the MRI apparatus dynamically changes the arrangement of the volumes. For example, if the operator changes the number of movements of the couch in the example shown in FIG. 4 to four times, the MRI apparatus increases one volume, and rearranges each of the volumes in accordance with the observation points as shown in FIG. 5.

The operator repeats the above operations until the volumes are appropriately arranged, and then instructs the MRI apparatus to perform actual scanning. When receiving the instruction, the MRI apparatus sets slice areas based on the arrangement of the volumes on the positioning images at the moment, and performs actual scanning.

Thus, according to the slice-area setting method performed by the MRI apparatus according to the embodiment, when performing scanning a plurality of number times by moving the couch, the MRI apparatus can easily set a slice area for each scanning.

Figure 6:
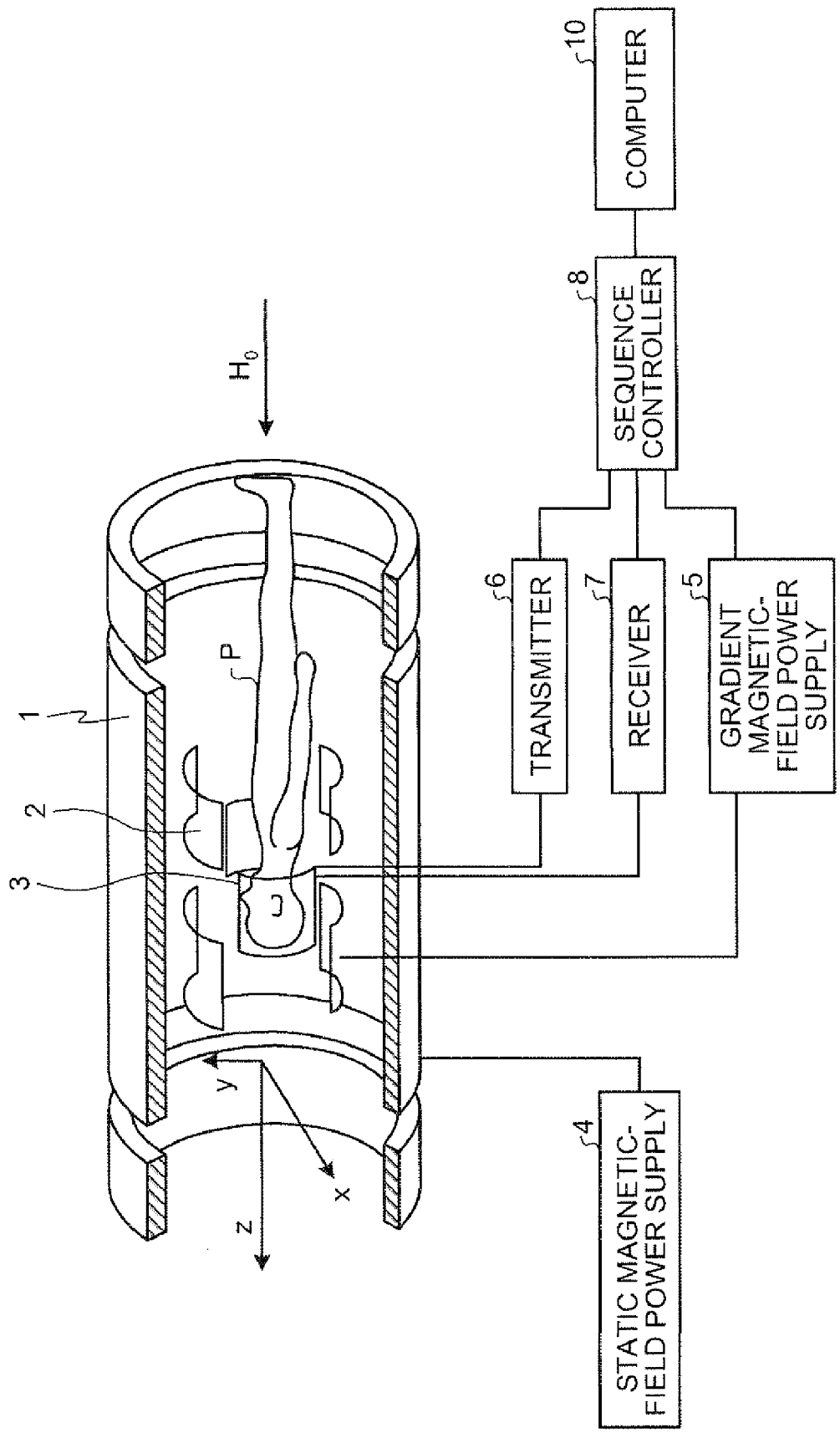
FIG. 6 is a functional block diagram of an MRI apparatus according to the embodiment.

A configuration of the MRI apparatus according to the embodiment is explained below with reference to FIG. 6. As shown in FIG. 6, the MRI apparatus includes a static magnetic-field magnet 1, a gradient magnetic-field coil 2, a radiofrequency (RF) coil 3, a static magnetic-field power supply 4, a gradient magnetic-field power supply 5, a transmitter 6, a receiver 7, a sequence controller 8, and a computer 10.

The static magnetic-field magnet 1 is a magnet formed in a cylindrical shape, and generates a static magnetic field $H_0$ in a space inside a cylinder in which the object P is placed using a current supplied from the static magnetic-field power supply 4. The gradient magnetic-field coil 2 is three pairs of coils arranged inside the static magnetic-field magnet 1, and generates a gradient magnetic field inside the static magnetic-field magnet 1 along three directions of the x, y, and z-axes using a current supplied from the gradient magnetic-field power supply 5.

The RF coil 3 is arranged to be opposed to the object P inside the opening of the static magnetic-field magnet 1, irradiates the object P with an RF wave sent from the transmitter 6, and receives a magnetic resonance (MR) signal emitted from hydrogen nuclei in the object P owing to excitation. The static magnetic-field power supply 4 supplies a current to the static magnetic-field magnet 1, and the gradient magnetic-field power supply 5 supplies a current to the gradient magnetic-field coil 2 based on an instruction from the sequence controller 8.

The transmitter 6 sends an RF wave to the RF coil 3 based on an instruction from the sequence controller 8, and the receiver 7 detects the MR signal received by the RF coil 3, and creates raw data by digitalizing the MR signal. After creating the raw data from the MR signal, the receiver 7 sends the created raw data to the sequence controller 8.

The sequence controller 8 performs scanning of the object P by activating the gradient magnetic-field power supply 5, the transmitter 6, and the receiver 7, based on sequence information sent from the computer 10. The sequence information defines a procedure when scanning, such as the strength of power to be supplied to the gradient magnetic-field coil 2 by the gradient magnetic-field power supply 5 and the timing of supplying the power, the strength of an RF wave to be sent to the RF coil 3 by the transmitter 6 and the timing of sending the RF wave, and the timing of detecting the MR signal by the receiver 7.

When raw data is sent from the transmitter 6 as a result of scanning the object P, the sequence controller 8 transfers the raw data to the computer 10.

Figure 7:
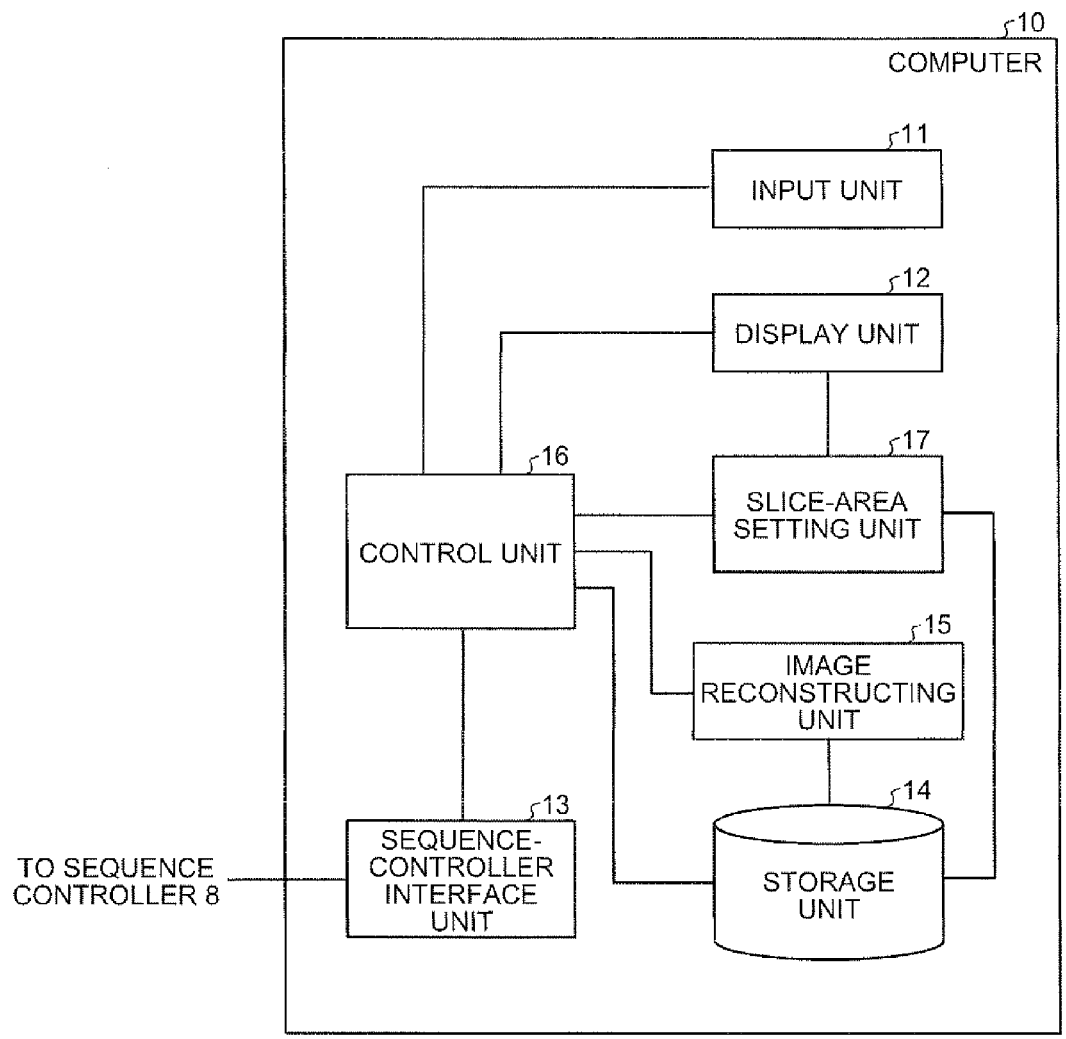
FIG. 7 is a functional block diagram of a computer shown in FIG. 6.

A configuration of a software program to be executed by the computer 10 shown in FIG. 6 is explained below with reference to FIG. 7.

The software program controls the MRI apparatus based on an instruction from the operator, and reconstructs an image from raw data sent from the sequence controller 8. As shown in FIG. 7, the software program includes an input unit 11, a display unit 12, a sequence-controller interface unit 13, a storage unit 14, an image reconstructing unit 15, a control unit 16, and a slice-area setting unit 17.

The input unit 11 is a tool to input various pieces of information, and can be implemented by a pointing device, such as a mouse or a trackball, and a keyboard. The input unit 11 receives an instruction about scanning and scanning conditions from the operator, by cooperating with the display unit 12.

For example, the input unit 11 receives from the operator instructions, such as an instruction to display a scan image, an instruction to display observation points shown in FIG. 2, an instruction to change an observation point, an instruction to set a slice area, an instruction to change scanning conditions, and an instruction to execute scanning. When receiving the instruction to set a slice area, the input unit 11, at the same time, allows the operator to specify the number of movements of the couch, and the size of a volume representing the slice area, which includes the slice length, the slice width, and the slice thickness, as the scanning conditions.

The display unit 12 displays various pieces of information, and can be implemented by a cathode ray tube (CRT) display, a liquid crystal display (LCD), or the like. For example, the display unit 12 displays an image reconstructed by the image reconstructing unit 15, and a graphical user interface (GUI) for receiving an instruction about scanning and scanning conditions from the operator.

The sequence-controller interface unit 13 controls sending and receiving of information to be exchanged between the computer 10 and the sequence controller 8. For example, the sequence-controller interface unit 13 sends sequence information for controlling activation of the gradient magnetic-field power supply 5, the transmitter 6, and the receiver 7 to the sequence controller 8, and receives raw data digitalized from a MR signal from the sequence controller B.

The storage unit 14 stores therein data and a computer program required for various processing performed by the computer 10, for example, raw data sent from the sequence controller 8, and an image reconstructed by the image reconstructing unit 15.

The image reconstructing unit 15 reconstructs an image from raw data sent from the sequence controller 8. Specifically, the image reconstructing unit 15 reads raw data stored in the storage unit 14 based on an instruction from the control unit 16, and reconstructs a three-dimensional image, such as a sagittal image, a coronal image, and an axial image, by performing a predetermined image reconstruction, such as Fourier transform, on the read raw data. After reconstructing the three-dimensional image, the image reconstructing unit 15 stores the reconstructed image into the storage unit 14.

The control unit 16 performs various processing for controlling scanning by the MRI apparatus based on an instruction from the operator. From among the various processing performed by the control unit 16, only processing particularly relevant to the present invention is explained below.

For example, when receiving an instruction to display a scan image via the input unit 11, the control unit 16 fetches the instructed image from images stored in the storage unit 14, and displays the fetched image on the display unit 12. When receiving an instruction to display images taken separately multiple times, the control unit 16 connects divided images, and then displays the connected images on the display unit 12.

When receiving via the input unit 11 an instruction to display observation points, an instruction to change an observation point, an instruction to set a slice area, or an instruction to change scanning conditions, the control unit 16 instructs the slice-area setting unit 17 to perform display of observation points, change of an observation point, setting of a slice area, or change in scanning conditions, based on each of the instructions.

When setting information for setting a slice area is sent from the slice-area setting unit 17 as a result of the instruction to set a slice area, the control unit 16 stores the setting information into an internal memory. The setting information includes information required for creating sequence information, for example, information indicating the size, the position, and the orientation/inclination of a slice area/slice volume.

When receiving an instruction to perform scanning via the input unit 11, the control unit 16 creates sequence information based on setting information stored in the internal memory at the moment, and sends the created sequence information to the sequence controller 8 via the sequence-controller interface unit 13.

As the control unit 16 sends the sequence information to the sequence controller 8, the sequence controller 8 performs scanning of the object P. As a result of the scanning based on the sequence information, raw data is transferred from the sequence controller 8, and then the control unit 16 causes the storage unit 14 to store therein the transferred raw data. The control unit 16 then instructs the image reconstructing unit 15 to reconstruct an image from the raw data stored in the storage unit 14.

The slice-area setting unit 17 sets a slice area for actual scanning by using positioning images. The positioning images to be used for the setting of a slice area are displayed on the display unit 12 by the control unit 16 prior to the setting of the slice area based on an instruction from the operator. As the positioning image, an image created by connecting images taken separately multiple times by moving the couch can be used.

Specifically, when the slice-area setting unit 17 is instructed by the control unit 16 to display observation points, the slice-area setting unit 17 displays a certain number of observation points at certain positions on a sagittal image and a coronal image displayed on the display unit 12 as the positioning images.

For example, when using the image created by connecting the images taken separately multiple times by moving the couch as the positioning image, the control unit 16 displays each of the observation points at a position centered in each of the images before connected.

After displaying the observation points, the slice-area setting unit 17 displays a wire frame that connects the displayed observation points (see FIG. 2).

Moreover, when the slice-area setting unit 17 is instructed by the control unit 16 to change an observation point, the slice-area setting unit 17 changes the observation point on the sagittal image and the coronal image displayed on the display unit 12 in accordance with an operation by the operator following to the instruction.

Specifically, when the operator carries out an operation to move an observation point, the slice-area setting unit 17 moves the observation point on the sagittal image and the coronal image in response to the operation. When the operator carries out an operation to add a new observation point between two observation points, the slice-area setting unit 17 adds the new observation point onto each of the images in response to the operation. When the operator carries out an operation to delete an observation point, the slice-area setting unit 17 deletes the observation point from each of the images in response to the operation. When the operator carries out an operation to add a new observation point branching out from one of the observation points as a branch point, the slice-area setting unit 17 adds the new observation point onto each of the images in response to the operation.

In this way, the slice-area setting unit 17 changes display of the observation points in accordance with each of the above operations, and when an observation point displayed on the sagittal image is changed, the slice-area setting unit 17 correspondingly changes the same observation point displayed on the coronal image at the same time. Likewise, when an observation point displayed on the coronal image is changed, the slice-area setting unit 17 changes the same observation point displayed on the sagittal image correspondingly to the change.

Thus, the operator can adjust the arrangement of the observation points while visually checking from two directions, and can arrange the observation points easily and accurately.

When an observation point is changed, the slice-area setting unit 17 changes the arrangement of the wire frame in accordance with the changed observation points (see FIG. 3).

When the arrangement of the observation points is changed, the slice-area setting unit 17 dynamically changes display of the wire frame based on the changed arrangement of the observation points, so that if the operator arranges the observation points on a blood vessel, the wire frame is displayed along the blood vessel. Accordingly, the operator can visually check displacement of the observation points from the blood vessel easily, so that the operator can arrange the observation points accurately on the blood vessel.

Moreover, when the slice-area setting unit 17 is instructed by the control unit 16 to set a slice area, the slice-area setting unit 17 arranges a volume representing the slice area based on scanning conditions (the number of movements of the couch, and a slice length, a slice width, and a slice thickness that indicate the size of the volume of the slice area) specified at the same time to the instruction, and observation points arranged on the positioning images at the moment.

Specifically, at first, the slice-area setting unit 17 divides a space reflected on each of the positioning images, namely the sagittal image and the coronal image, into spaces as many as the specified number of movements of the couch at regular intervals in a moving direction of the couch, and defines an approximate plane that resembles the distribution of the observation points with respect to each of the divided spaces based on observation points included in each of the spaces, for example, by using least square approximation.

Then, the slice area setting unit 17 defines a volume (rectangular parallelepiped) having the specified slice length, the specified slice width, and the specified slice thickness as three sides orthogonal to each other, and calculates the position and the orientation/inclination of the volume such that the most observation points are included inside the volume, and the volume is positioned in parallel with the approximate plane.

The slice area setting unit 17 then arranges the volume into each of the divided spaces based on the calculated position and the calculated orientation/inclination. When arranging the volume, if the specified slice length of the volume specified by the operator is longer than an interval of the divisions of the spaces, the volumes are arranged to overlap each other at the border of each space (see FIG. 4).

Moreover, after arranging the volumes, when the slice area setting unit 17 is instructed by the control unit 16 to change the observation points or the scanning conditions, the slice area setting unit 17 changes the arrangement of the observation points and the wire frame on the sagittal image and the coronal image in response to each of the instructions. Furthermore, the slice area setting unit 17 recalculates the position and the orientation/inclination of the volume based on the changed arrangement of the observation points, and rearranges the volumes based on the recalculated position and the recalculated inclination (see FIG. 5).

Thus, the operator can change an arrangement of observation points while checking the state of volumes, so that the operator can set a slice area efficiently.

Moreover, the operator can change the number of movements of the couch and the size of the volume while checking the state of the volumes, so that the operator can set a slice area efficiently.

When the volumes are rearranged, the slice area setting unit 17 sends setting information including the size, the position, and the orientation/inclination of the volume to the control unit 16 each time of rearrangement.

In addition to the procedure of the processing performed by the slice-area setting unit 17 as explained above, the processing can be performed as follows. For example, when volumes are arranged, the slice-area setting unit 17 calculates the shortest distance from each of observation points included in a volume to a slice plane (a plane of a rectangular parallelepiped having the slice length and the slice width as two sides), and specifies the closest observation point to the slice plane. If the distance from the specified observation point to the slice plane exceeds a threshold, the slice-area setting unit 17 reduces the slice thickness of the volume to an extent at which the distance satisfies the threshold.

Generally, as the slice thickness increases, the time required for scanning increases. Therefore, the time required for scanning can be reduced to the minimum time by setting the size of the volume to make the slice thickness as thin as possible in this way.

On the other hand, when observation points are scattered to a great extent, there is a case where all of the observation points may not be included within a volume depending on a size of the volume specified by the operator. In such case, the slice-area setting unit 17 can be configured to notify the operator that some of the observation points are not included in the slice area by changing a color of display or flashing of display of an observation point not included in the volume. The notification can suggest rethinking the size of the volume and the scanning conditions to the operator.

Figure 8:
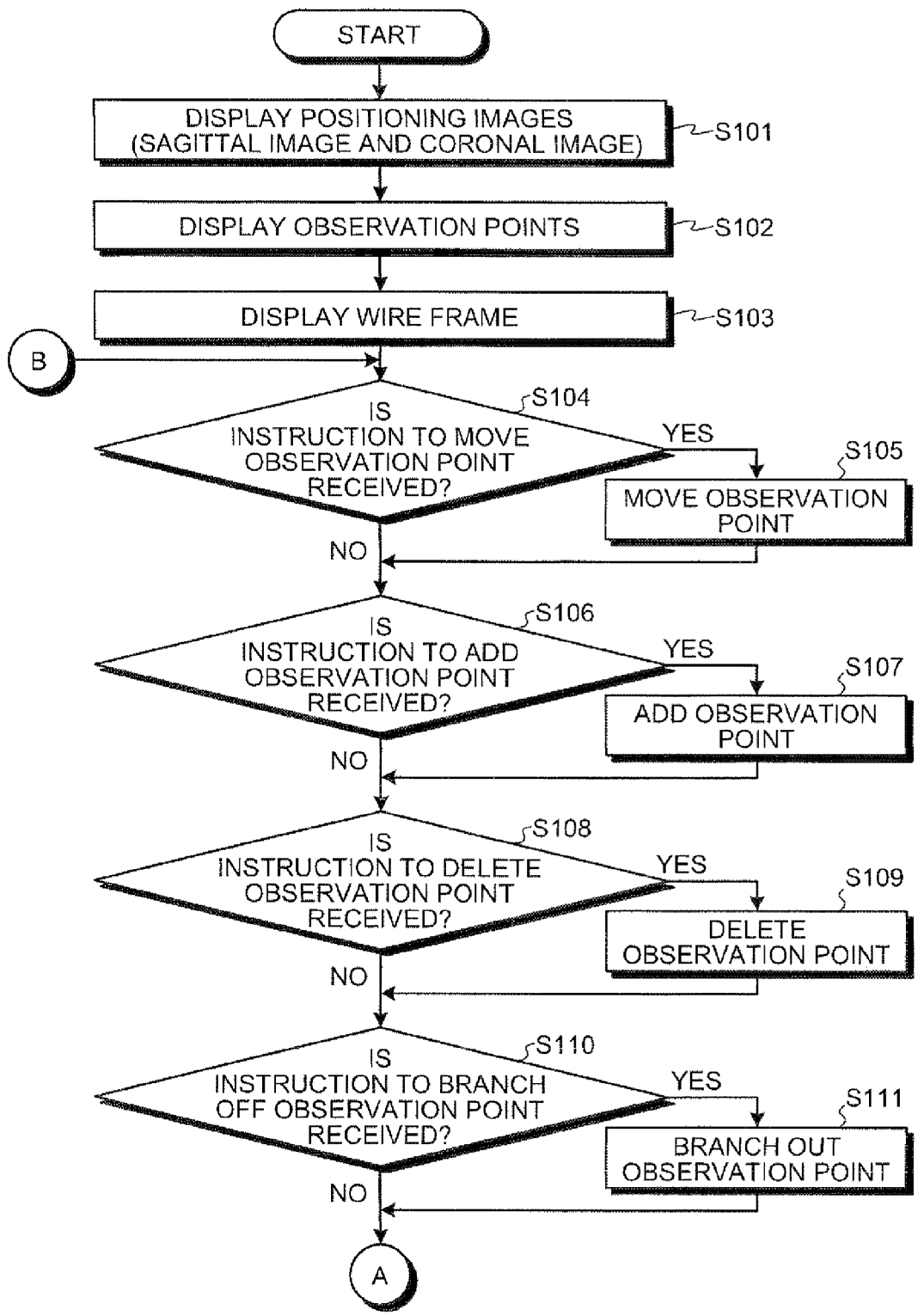
FIG. 8 is a flowchart of a slice-area setting process performed by the computer shown in FIG. 6 (part 1)

A flow of setting a slice area performed by the computer 10 is explained below with reference to FIGS. 8 and 9. As shown in FIG. 8, when the computer 10 is instructed by the operator to display the positioning images, the control unit 16 displays the specified sagittal image and the specified coronal image of the object P on the display unit 12 (Step S101).

Subsequently, when receiving an instruction to display the observation points from the operator, the slice-area setting unit 17 displays the observation points onto the sagittal image and the coronal image displayed on the display unit 12 (Step S102), and further displays the wire frame that connects the displayed observation points (Step S103).

After that, if receiving an instruction to move an observation point from the operator (Yes at Step S104), the slice-area setting unit 17 moves the observation point on the sagittal image and the coronal image in response to the instruction (Step S105).

If receiving an instruction to add an observation point from the operator (Yes at Step S106), the slice-area setting unit 17 adds a new observation point between two observation points displayed on the sagittal image and the coronal image in response to the instruction (Step S107).

If receiving an instruction to delete an observation point from the operator (Yes at Step S108), the slice-area setting unit 17 deletes the observation point displayed on the sagittal image and the coronal image in response to the instruction (Step S109).

If receiving an instruction to branch off an observation point from the operator (Yes at Step S110), the slice-area setting unit 17 adds a new observation point to branch off from one of the observation points displayed on the sagittal image and the coronal image based on the instruction (Step S111).

Subsequently as shown in FIG. 9, if receiving the number of movements of the couch as scanning conditions from the operator (Yes at Step S112), and if receiving the size of a volume representing a slice area (Yes at Step S113), the slice-area setting unit 17 calculates the position and the inclination of the volume based on the observation points and the scanning conditions (Step S114), and arranges the volume on the sagittal image and the coronal image displayed on the display unit 12 based on the calculated position and the calculated inclination (Step S115).

The computer 10 repeats the processing of steps S104 to S115 until the operator completes the operation for setting the slice area. When the setting of the slice area is completed, the computer 10 terminates the processing (Yes at Step S116).

Thus, the operator can change an arrangement of observation points while checking the state of volumes, so that the operator can set a slice area efficiently.

Thus, according to the embodiment, when performing scanning a plurality of number times by moving the couch, a slice area for each scanning can be easily set.

Although the embodiment is explained in the case where the MRI apparatus receives an operation about an arrangement of observation points and scanning conditions from an operator, and sets a slice area with respect to each movement of the couch based on the observation points and the scanning conditions, the method of setting a slice area is not limited to this. For example, the MRI apparatus can be configured to acquire characteristic information representing anatomical characteristics of an object from a positioning image taken in advance, and to set a slice area based on the acquired characteristic information.

In such case, the slice-area setting unit 17 extracts the length of a scan region along the direction of moving the couch from the positioning image of the object, and calculates the number of movements of the couch from the extracted length. The slice-area setting unit 17 then extracts the contour of the scan region from the positioning image, and calculates from the extracted contour the size and the direction of the slice area with respect to each of positions to which the couch is to be moved (hereinafter, "couch positions") such that the scan region is included in the slice area at each of the couch positions. The slice-area setting unit 17 then sets a slice area with respect to each of the couch positions in accordance with the calculated number of movements and the calculated size and direction of the slice area as scanning conditions.

For example, when scanning bone, the slice-area setting unit 17 extracts the contour of the bone from the positioning image, and detects a length, a thickness, and a direction of the bone, from the extracted contour. Based on the detected length, the detected thickness, and the detected direction, the slice-area setting unit 17 then set a slice area with respect to each of the couch positions such that the slice area has a size and a direction to include the whole bone at each of the positions of the couch.

Thus, the MRI apparatus can automatically set a slice area based on the positioning image of the object, so that the operator can set a slice area more easily.

During the automatic setting of a slice area, the slice-area setting unit 17 can be configured to receive information about the number of movements of the couch and the size of the slice area from the operator, and to set the slice area by determining scanning conditions based on the received information.

Alternatively, the slice-area setting unit 17 can be configured to arrange observation points indicating portions to be included in the slice area onto the positioning image based on characteristic information acquired from the positioning image, and to set a slice area that includes the observation points with respect to each of the couch positions based on the arranged observation points and scanning conditions. In such case, the slice-area setting unit 17 sets observation points in accordance with a shape and a size of a scan region based on the characteristic information representing anatomical characteristics acquired from the positioning image.

For example, when scanning the inside of a femur, the slice-area setting unit 17 extracts the contour of the femur from the positioning image, and detects a length, a thickness, and a direction of the femur from the extracted contour. The slice-area setting unit 17 then divides the object region of the femur to be scanned into a certain number of regions determined based on the detected length, and arranges an observation point at a position centered in each of the regions. The slice-area setting unit 17 then sets a slice area with respect to each of the couch positions such that the slice area includes the observation point at each of the positions of the couch.

Although the embodiment is explained in the case where the volumes V are arranged by laying out only along the direction of the body axis of the object P as shown in FIG. 4, if a plurality of body parts are displayed on the positioning image, slice areas can be set separately with respect to each of the body parts in accordance with branches of the wire frame. For example, when right and left lower limbs are displayed on the positioning image, volumes V are arranged with respect to each of the right and left lower limbs.

Although the embodiment is explained in the case where a sagittal image and a coronal image are used as positioning images, the present invention is not limited to this, but can also be applied to a case where other images taken from different angles, including an axial image, are used as positioning images.

In other words, when the slice-area setting unit 17 arranges observation points on each of positioning images taken from different angles, and changes an arrangement of the observation points arranged on one of the positioning images, the slice-area setting unit 17 changes an arrangement of the observation points arranged on the other positioning image(s) in conjunction with the former change. Accordingly, the operator can adjust the arrangement of the observation points while visually checking from a plurality of directions, and can arrange the observation points easily and accurately.

According to the embodiment, an image created by connecting images taken separately multiple times by moving the couch can be used as a positioning image, and the number of movements of the couch during the scanning for the positioning image does not need to match the number of movements of the couch specified as a scanning condition of actual scanning. Accordingly, the MRI apparatus can perform scanning efficiently, for example, by scanning for the positioning image as few times of movements as possible at least to obtain an image quality good enough to arrange observation points, while scanning at the actual scanning an increased number of movements to obtain a high quality image.

When using a positioning image created by connecting separate images, connecting portions do not need to be overlapped. Accordingly, when performing scanning for a positioning image separately multiple times, the number of movements of the couch can be reduced by scanning only portions required to arrange observation points, so that time to be taken to perform scanning for the positioning image can be shortened. Consequently, the total time to be taken for scanning can be decreased, so that a stress on a patient who is the object can be reduced.

Although the embodiment is explained in the case of using one computer, the units explained above can be arranged in a plurality of computers to work in a distributed manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) apparatus comprising:
    an MRI observation-point arranging unit that arranges and defines plural operator designated observation points on a previously obtained MRI positioning image on an MRI display device, each operator designated observation point indicating a portion of an object which is to be included in a slice volume of a later performed diagnostic MRI scan;
    a scanning-condition receiving unit that receives data specifying (a) a number of couch position movements on which said object is placed during the later diagnostic MRI scanning and (b) a size of the slice volume which is to be imaged at each couch position;
    a slice-volume setting unit that sets orientation of the slice volume in order to include a maximum number of said operator designated observation points therewithin at each position to which the couch is moved, based on the previously arranged operator designated observation points and the previously received scanning conditions; and
    an MRI diagnostic scanning unit that subsequently scans the object at each of the multiple couch positions, based on the respectively corresponding slice volume set by the slice-volume setting unit and outputs scanned MR image data of each said slice volume at its respectively corresponding orientation and couch position.

2. The magnetic resonance imaging apparatus according to claim 1, further comprising:
    an observation-point changing unit that changes an arrangement of the operator designated observation points arranged by the observation-point arranging unit,
    wherein, when the arrangement of the operator designated observation points is changed by an observation-point changing unit, the slice-volume setting unit resets corresponding slice volumes based on a changed arrangement of the operator designated observation points.

3. The magnetic resonance imaging apparatus according to claim 2, wherein:
    the observation-point arranging unit arranges the operator designated observation points on each of a plurality of positioning images taken from different angles, and
    when an arrangement of the operator designated observation points arranged on one of the positioning images is changed, the observation-point changing unit changes an arrangement of the operator designated observation points arranged on each of the other positioning images in an interlocked manner.

4. The magnetic resonance imaging apparatus according to claim 2, wherein:
    when there is an instruction to move an observation point, the observation-point changing unit moves the observation point arranged by the observation-point arranging unit, based on the instruction.

5. The magnetic resonance imaging apparatus according to claim 2, wherein:
    when there is an instruction to delete an observation point, the observation-point changing unit deletes the observation point arranged by the observation-point arranging unit, based on the instruction.

6. The magnetic resonance imaging apparatus according to claim 2, wherein:
    when there is an instruction to add an observation point, the observation-point changing unit adds the observation point arranged by the observation-point arranging unit, based on the instruction.

7. The magnetic resonance imaging apparatus according to claim 2, further comprising:
    a scanning-condition changing unit that changes a scanning condition received by the scanning-condition receiving unit, wherein, when a scanning condition is changed by the scanning-condition changing unit, the slice-volume setting unit resets the slice-volume based on a changed scanning condition.

8. The magnetic resonance imaging apparatus according to claim 3, further comprising:
a scanning-condition changing unit that changes a scanning condition received by the scanning-condition receiving unit,
wherein, when the scanning condition is changed by the scanning-condition changing unit, the slice-volume setting unit resets the slice-volume based on a changed scanning condition.

9. The magnetic resonance imaging apparatus according to claim 2, further comprising:
a connecting-line displaying unit that displays a connecting line that connects operator designated observation points on the previously obtained positioning image when the operator designated observation points are arranged by the observation-point arranging unit; and
a connecting-line changing unit that changes, when an arrangement of the operator designated observation points is changed by the observation-point changing unit, a display of the connecting line based on a changed arrangement of the operator designated observation points.

10. The magnetic resonance imaging apparatus according to claim 3, further comprising:
a connecting-line displaying unit that displays a connecting line that connects operator designated observation points on the previously obtained positioning image when the operator designated observation points are arranged by the observation-point arranging unit; and
a connecting-line changing unit that changes, when an arrangement of the operator designated observation points is changed by the observation-point changing unit, a display of the connecting line based on a changed arrangement of the operator designated observation points.

11. A magnetic resonance imaging (MRI) apparatus comprising:
a characteristic-information acquiring unit that acquires characteristic information representing anatomical characteristics of an object from a previously obtained MRI positioning image of the object;
a scanning-condition determining unit that determines scanning conditions including (a) a number of movements of a couch position on which the object will be placed during subsequent diagnostic MRI scanning and (b) a size of a slice volume which is to be imaged at each couch position, based on the characteristic anatomical information previously acquired by the characteristic-information acquiring unit;
a slice-volume setting unit that automatically sets the slice-volume orientation at each couch position to which the couch is moved in order to optimally include portions of said anatomical characteristics therewithin corresponding to the characteristic information acquired by the characteristic-information acquiring unit at each position to which the couch is moved, based on the scanning conditions determined by the scanning-condition determining unit; and
an MRI diagnostic scanning unit that subsequently scans the object at each of the multiple couch positions, based on the respectively corresponding slice-volume set by the slice-volume setting unit and outputs scanned MR image data of each said slice-volume at its respectively corresponding orientation and couch position.

12. The magnetic resonance imaging apparatus according to claim 11, further comprising a scanning-condition receiving unit that receives information on the number of movements of the couch during scanning and the size of the slice-volume, wherein:
the scanning-condition determining unit determines the scanning condition based on the information received by the scanning-condition receiving unit.

13. The magnetic resonance imaging apparatus according to claim 11, further comprising:
an observation-point arranging unit that arranges plural observation points, each point indicating a portion to be included in the slice-volume on the previously obtained positioning image displayed on a display device, based on the characteristic anatomical information previously acquired by the characteristic-information acquiring unit,
wherein the slice-volume setting unit sets the slice-volume in order to include at least one observation point arranged by the observation-point arranging unit at each position to which the couch is moved, based on the observation points arranged by the observation-point arranging unit and the scanning conditions determined by the scanning-condition determining unit.

14. The magnetic resonance imaging apparatus according to claim 12, further comprising:
an observation-point arranging unit that arranges plural observation points, each point indicating an operator designated portion to be included in the slice-volume on the previously obtained positioning image displayed on a display device, based on the characteristic anatomical information previously acquired by the characteristic-information acquiring unit,
wherein the slice-volume setting unit sets the slice-volume in order to include at least one observation point arranged by the observation-point arranging unit at each position to which the couch is moved, based on the observation points arranged by the observation-point arranging unit and the scanning conditions determined by the scanning-condition determining unit.

15. The magnetic resonance imaging apparatus according to claim 14, further comprising:
an observation-point changing unit that changes an arrangement of the observation points arranged by the observation-point arranging unit,
wherein, when the arrangement of the observation points is changed by the observation-point changing unit, the slice-volume setting unit resets the slice-volumes based on a changed arrangement of the observation points.

16. The magnetic resonance imaging apparatus according to claim 15, wherein:
the observation-point arranging unit arranges the observation points on each of a plurality of previously obtained positioning images taken from different angles, and
when an arrangement of the observation points arranged on one of the previously obtained positioning images is changed, the observation-point changing unit changes an arrangement of the observation points arranged on each of the other previously obtained positioning images in an interlocked manner.

17. The magnetic resonance imaging apparatus according to claim 15, wherein:
when there is an instruction to move an observation point, the observation-point changing unit moves the observation point arranged by the observation-point arranging unit, based on the instruction.

18. The magnetic resonance imaging apparatus according to claim 15, wherein:
when there is an instruction to delete an observation point, the observation-point changing unit deletes the observation point arranged by the observation-point arranging unit, based on the instruction.

19. The magnetic resonance imaging apparatus according to claim 15, wherein:
when there is an instruction to add an observation point, the observation-point changing unit adds the observation point arranged by the observation-point arranging unit, based on the instruction.

20. The magnetic resonance imaging apparatus according to claim 15, further comprising:
a scanning-condition changing unit that changes a scanning condition received by the scanning-condition receiving unit,
wherein, when a scanning condition is changed by the scanning-condition changing unit, the slice-volume setting unit resets each of the slice-volumes based on a changed scanning condition.

21. The magnetic resonance imaging apparatus according to claim 16, further comprising:
a scanning-condition changing unit that changes a scanning condition received by the scanning-condition receiving unit,
wherein, when the scanning condition is changed by the scanning-condition changing unit, the slice-volume setting unit resets each of the slice-volumes based on a changed scanning condition.

22. The magnetic resonance imaging apparatus according to claim 15, further comprising:
a connecting-line displaying unit that displays a connecting line that connects observation points on the previously obtained positioning image when the observation points are arranged by the observation-point arranging unit; and
a connecting-line changing unit that changes, when an arrangement of the observation points is changed by the observation-point changing unit, a display of the connecting line based on a changed arrangement of the observation points.

23. The magnetic resonance imaging apparatus according to claim 16, further comprising:
a connecting-line displaying unit that displays a connecting line that connects observation points on the previously obtained positioning image when the observation points are arranged by the observation-point arranging unit; and
a connecting-line changing unit that changes, when an arrangement of the observation points is changed by the observation-point changing unit, a display of the connecting line based on a changed arrangement of the observation points.

24. A method of setting the orientation of a magnetic resonance imaging (MRI) slice-volume, said method comprising:
arranging and defining plural operator designated observation points on a previously obtained MRI positioning image displayed on an MRI display device, each operator designated observation point indicating a portion to be included in a slice-volume for a later performed diagnostic MRI scan;
receiving specification of scanning conditions including (a) a number of couch position movements on which an object is placed during the later diagnostic MRI scanning and (b) a size of the slice volume which is to be imaged at each couch position;
setting the slice volume orientation at each couch position in order to include a maximum possible number of said operator designated observation points therewithin at each couch position, based on the arranged operator designated observation points and the received scanning conditions;
performing diagnostic MRI scanning of the object at each of said multiple couch positions, based on the respectively corresponding set slice volume for that couch position; and
outputting scanned MR image data of each said slice-volume at its respectively corresponding orientation and couch position.

25. A method of setting orientation of magnetic resonance imaging (MRI) slice-volumes, said method comprising:
acquiring characteristic information representing anatomical characteristics of an object from a previously obtained MRI positioning image of the object;
determining scanning conditions including (a) a number of movements of a couch position on which the object is placed during subsequent diagnostic MRI scanning and (b) a size of an MRI slice-volume which is to be imaged at each couch position, based on the previously acquired characteristic anatomical information;
automatically setting the slice-volume orientation for each couch position in order to optimally include portions of said anatomical characteristics therewithin corresponding to the characteristic information acquired by the characteristic-information acquiring unit at each position to which the couch is moved, based on the determined scanning conditions for that couch position;
performing diagnostic MRI scanning of the object at each of the multiple couch positions, based on the respectively corresponding set slice volume; and
outputting scanned MR image data of each said slice-volume at its respectively corresponding orientation and couch position.

* * * * *

UNITED STATES PATENT AND TRADEMARK OFFICE
CERTIFICATE OF CORRECTION

PATENT NO.         : 7,659,720 B2
APPLICATION NO.    : 12/020335
DATED              : February 9, 2010
INVENTOR(S)        : Furudate It is certified that error appears in the above-identified patent and that said Letters Patent is hereby corrected as shown below:

On the title page, add the following assignee data, item (73):

KABUSHIKI KAISHA TOSHIBA              MINATO-KU, TOKYO, JAPAN

TOSHIBA MEDICAL SYSTEMS CORPORATION   OTAWARA-SHI, TOCHIGI, JAPAN

Signed and Sealed this

Fourteenth Day of September, 2010

David J. Kappos
*Director of the United States Patent and Trademark Office*